United States Patent [19]
Nagaraj et al.

[11] Patent Number: 5,723,078
[45] Date of Patent: Mar. 3, 1998

[54] METHOD FOR REPAIRING A THERMAL BARRIER COATING

[75] Inventors: Bangalore A. Nagaraj, West Chester; Seetharamaiah Mannava; Bhupendra K. Gupta, both of Cincinnati, all of Ohio

[73] Assignee: General Electric Company, Cincinnati, Ohio

[21] Appl. No.: 651,183

[22] Filed: May 24, 1996

[51] Int. Cl.$^6$ .................. B32B 35/00; B23P 6/00
[52] U.S. Cl. .............. 264/36; 29/402.07; 29/402.18; 427/140; 427/142; 428/63
[58] Field of Search ............... 264/36; 427/140, 427/142, 446, 452; 156/94, 98; 29/402.07, 402.13, 402.18; 428/63

[56] References Cited

U.S. PATENT DOCUMENTS

| | | | |
|---|---|---|---|
| 4,743,462 | 5/1988 | Radzavich | 427/452 |
| 5,210,944 | 5/1993 | Monson | 29/889.2 |
| 5,254,413 | 10/1993 | Maricocchi | 427/140 |
| 5,419,971 | 5/1995 | Skelly et al. | 428/612 |

Primary Examiner—Daniel Stemmer
Attorney, Agent, or Firm—Andrew C. Hess; David L. Narciso

[57] ABSTRACT

A method of repairing a thermal barrier coating on an article designed for use in a hostile thermal environment, such as turbine, combustor and augmentor components of a gas turbine engine. The method is particularly suited for the repair of thermal barrier coatings composed of a metallic bond layer formed on the surface of the article, and a columnar ceramic layer overlaying the bond layer. The method entails the steps of cleaning the bond layer exposed by localized spallation, treating the bond layer so as to texture its exposed surface, and then depositing a ceramic material on the surface of the bond layer so as to form a ceramic repair layer that completely covers the bond layer. Deposition of the repair layer can be carried out such that its upper surface projects above the adjacent ceramic layer, followed by abrading the repair layer to a height substantially level with the ceramic layer.

20 Claims, 1 Drawing Sheet

METHOD FOR REPAIRING A THERMAL BARRIER COATING

The Government has rights to this invention pursuant to Contract No. N00140-92E-BD36 and N00019-92-C-0149 awarded by the Department of the Navy.

This invention relates to thermal barrier coatings for components exposed to high temperatures, such as the hostile thermal environment of a gas turbine engine. More particularly, this invention is directed to a method for repairing a thermal barrier coating that has suffered localized spallation of its thermal-insulating ceramic layer.

BACKGROUND OF THE INVENTION

Higher operating temperatures of gas turbine engines are continuously sought in order to increase their efficiency. However, as operating temperatures increase, the high temperature durability of the components of the engine must correspondingly increase. Significant advances in high temperature capabilities have been achieved through formulation of nickel and cobalt-base superalloys, though such alloys alone are often inadequate to form components located in certain sections of a gas turbine engine, such as the turbine, combustor and augmentor. A common solution is to thermally insulate such components in order to minimize their service temperatures. For this purpose, thermal barrier coatings (TBC) formed on the exposed surfaces of high temperature components have found wide use.

To be effective, thermal barrier coatings must have low thermal conductivity, strongly adhere to the article, and remain adherent throughout many heating and cooling cycles. The latter requirement is particular demanding due to the different coefficients of thermal expansion between materials having low thermal conductivity and superalloy materials typically used to form turbine engine components. Thermal barrier coatings capable of satisfying the above requirements have generally included a metallic bond layer deposited on the component surface, followed by an adherent ceramic layer that serves to thermally insulate the component. In order to promote the adhesion of the ceramic layer to the component and prevent oxidation of the underlying superalloy, the bond layer is typically formed from an oxidation-resistant alloy such as MCrAlY where M is iron, cobalt and/or nickel, or from an oxidation-resistant intermetallic such as a diffusion aluminide or platinum aluminide. Various ceramic materials have been employed as the ceramic layer, particularly zirconia ($ZrO_2$) stabilized by yttria ($Y_2O_3$), magnesia (MgO) or another oxide. These particular materials are widely employed in the art because they can be readily deposited by plasma spray, flame spray and vapor deposition techniques, and are reflective to infrared radiation so as to minimize the absorption of radiated heat.

A significant challenge of thermal barrier coating systems has been the formation of a more adherent ceramic layer that is less susceptible to spalling when subjected to thermal cycling. For this purpose, the prior art has proposed various coating systems, with considerable emphasis on ceramic layers having enhanced strain tolerance as a result of the presence of porosity, microcracks and segmentation of the ceramic layer. Microcracks generally denote random internal discontinuities within the ceramic layer, while segmentation indicates the presence of microcracks or crystalline boundaries that extend perpendicularly through the thickness of the ceramic layer, thereby imparting a columnar grain structure to the ceramic layer. Thermal barrier coating systems employed in high temperature applications of a gas turbine engine are typically deposited by physical vapor deposition (PVD) techniques that yield the desirable columnar grain structure, which is able to expand without causing damaging stresses that lead to spallation, as evidenced by the results of controlled thermal cyclic testing. A strong adherent continuous oxide surface layer is often formed over the bond layer to protect the bond layer from oxidation and hot corrosion, and to provide a firm foundation for the PVD columnar ceramic layer.

Though significant advances have been made in attaining spallation-resistant thermal barrier coatings, there is the inevitable requirement to repair such coatings under certain circumstances, particularly high temperature components of gas turbine engines that are subjected to intense thermal cycling. Typically, spallation occurs in localized regions or patches, either during engine service or during post coating processing of the coated component. The size and location of spallation depend on the particular component and its service and processing conditions. The current state-of-the-art repair method is to completely remove the thermal barrier coating, restore or repair the bond layer surface as necessary, and then recoat the component. However, due to its heightened resistance to spallation, a columnar ceramic layer is very difficult to remove. Prior art techniques for removing thermal barrier coatings from engine components have generally involved grit blasting the coating or subjecting the coating to an alkaline solution at high temperatures and pressures. However, grit blasting is a slow, labor-intensive process and erodes the surface beneath the coating. With repetitive use, the grit blasting process eventually destroys the component. The use of an alkaline solution to remove a thermal barrier coating is also less than ideal, since the process requires the use of an autoclave operating at high temperatures and pressures.

The above-noted difficulties are exacerbated when the component is an assembly or has a complex geometry. For example, in the manufacture of a high pressure turbine nozzle segment for a gas turbine engine, individual airfoils are typically coated with a thermal barrier coating deposited by physical vapor deposition, and two or three airfoils are brazed to bands to form the segment. If spallation occurs on the segment, it is generally impractical to strip the thermal barrier coating off the entire segment, since reapplying the thermal barrier coating would require that the nozzles be separated from the bands.

From the above, it is apparent that current practices for repairing thermal barrier coatings are labor-intensive and expensive, and can be difficult to perform on certain components such as nozzle segments of a gas turbine engine. Accordingly, it would be desirable to provide a method for repairing a thermal barrier coating that reduces the cost of repair and can be employed on a wide variety of components, particularly those employed in gas turbine engines.

SUMMARY OF THE INVENTION

It is an object of this invention to provide a method for repairing a thermal barrier coating on an article designed for use in a hostile thermal environment.

It is another object of this invention that such a method requires the repair of only the damaged or spalled regions of the article, and therefore does not require the removal of the entire thermal barrier coating.

It is yet another object of this invention that the method is particularly well suited for repairing thermal barrier coatings that include an insulating ceramic layer characterized by a columnar grain structure.

The present invention generally provides a method of repairing a thermal barrier coating on an article designed for use in a hostile thermal environment, such as turbine, combustor and augmentor components of a gas turbine engine. This method is particularly suited for the repair of thermal barrier coatings composed of a metallic bond layer formed on the surface of the article, and an insulating columnar ceramic layer overlaying the bond layer. Generally, the processing steps of the invention include cleaning the bond layer exposed by localized spallation so as to remove oxides and residue of the spalled ceramic layer, selectively treating the bond layer so as to texture its exposed surface, and then depositing a ceramic material on the surface of the bond layer so as to form a ceramic repair layer that completely covers the bond layer. Deposition of the repair layer can be carried out such that its upper surface projects above the adjacent ceramic layer, followed by abrading the repair layer to a height substantially level with the ceramic layer.

According to this invention, the ceramic repair layer need not be deposited using the same technique as that for depositing the columnar ceramic layer. For example, the ceramic layer can be originally deposited on the article by a physical vapor deposition technique to yield the desired columnar grain structure, yet the ceramic repair layer might be deposited by a plasma spray (PS) technique such that the repair layer does not exhibit the columnar grain structure. Surprisingly, it has been found that thermal barrier coatings repaired with a plasma sprayed repair layer can exhibit a thermal cycle life equivalent to that of a conventional thermal barrier coating deposited by physical vapor deposition.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

The present invention is generally applicable to metal components that operate within environments characterized by relatively high temperatures, and are therefore subjected to severe thermal stresses and thermal cycling. Notable examples of such components include the high and low pressure turbine nozzles and blades, shrouds, combustor liners and augmentor hardware of gas turbine engines. While the advantages of this invention are particularly applicable to components of gas turbine engines, the teachings of this invention are generally applicable to any component in which a thermal barrier may be used to thermally insulate the component from its environment.

Figure 1:
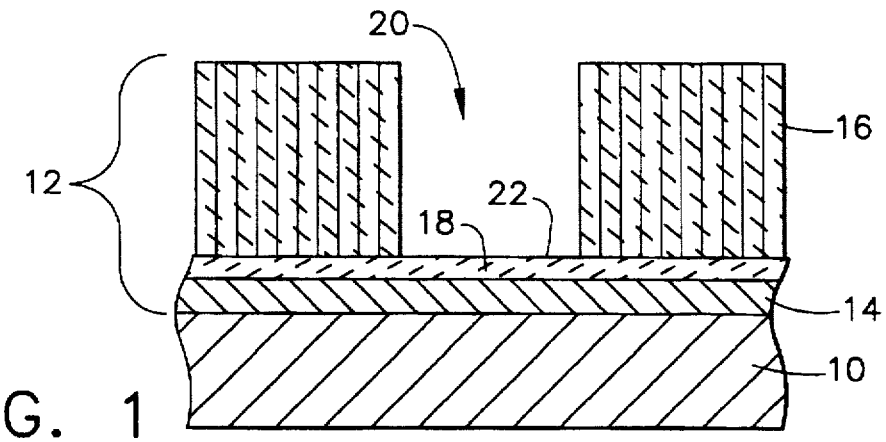
FIG. 1 shows a cross-sectional representation of a component that has suffered localized spallation.

As represented in FIG. 1, the method of this invention is particularly suited for the repair of a thermal barrier coating system 12 composed of a metallic bond layer 14 formed on the surface of the article 10, and a columnar ceramic layer 16 overlaying the bond layer 14. As is the situation with high temperature components of a gas turbine engine, the article 10 may be formed of a nickel-base or cobalt-base superalloy. The bond layer 14 is preferably formed of a metallic oxidation-resistant material, so as to protect the underlying article 10 from oxidation and enable the ceramic layer 16 to more tenaciously adhere to the article 10. A preferred bond layer 14 is formed by a nickel-base alloy powder, such as NiCrAlY, or an intermetallic nickel or platinum aluminide, which has been deposited on the surface of the article 10 to a thickness of about 20 to about 125 micrometers. Preferred methods for depositing bond layers of the type described above include vapor deposition techniques for aluminide coatings and low pressure plasma spray (LPPS) techniques for a NiCrAlY bond coat, though it is foreseeable that other deposition methods such as air plasma spray (APS) or physical vapor deposition (PVD) techniques could be used. Following deposition of the bond layer 14, an oxide layer 18 such as alumina may be formed on the surface of the bond layer 14 at an elevated temperature. The oxide layer 18 provides a surface to which the columnar ceramic layer 16 can tenaciously adhere, thereby promoting the resistance of the coating system 12 to thermal shock.

To attain the desired strain-tolerant columnar grain structure represented in the Figures, the ceramic layer 16 is preferably deposited by physical vapor deposition using techniques known in the art. A preferred material for the ceramic layer 16 is an yttria-stabilized zirconia (YSZ), a preferred composition being about 6 to about 8 weight percent yttria, though other ceramic materials could be used, such as yttria, nonstabilized zirconia, or zirconia stabilized by ceria ($CeO_2$) or scandia ($Sc_2O_3$). The ceramic layer 16 is deposited to a thickness that is sufficient to provide the required thermal protection for the article 10, generally on the order of about 75 to about 300 micrometers.

As a component of a gas turbine engine, surfaces of the article 10 are subjected to hot combustion gases during operation of the engine, and are therefore subjected to severe attack by oxidation, corrosion and erosion. Accordingly, the article 10 must remain protected from the hostile environment of the turbine section by the thermal barrier coating system 12, and loss of the ceramic layer 16 will lead to premature and often rapid deterioration of the article 10. Localized spallation 20 of the ceramic layer 16 is represented in FIG. 1, with the repair process of this invention being represented in FIGS. 2 and 3.

The repair method of this invention begins with cleaning the bond layer 14 exposed by the localized spallation 20 so as to remove oxides and any residual fragments of the ceramic and oxide layers 16 and 18. While various techniques can be used, a preferred method is to grit blast the exposed surface of the bond layer 14, such as by a technique known as pencil grit blasting. This step is selectively performed to ensure that the remaining ceramic layer 16 is not subjected to the procedure. It may be desirable to mask the surrounding ceramic layer 16 with, for example, tape masking, during the grit blasting operation. In addition to providing a level of protection to the ceramic layer 16, tape masking would also serve as a proof test for the integrity of the ceramic layer 16 immediately surrounding the spallation 20.

Figure 2:
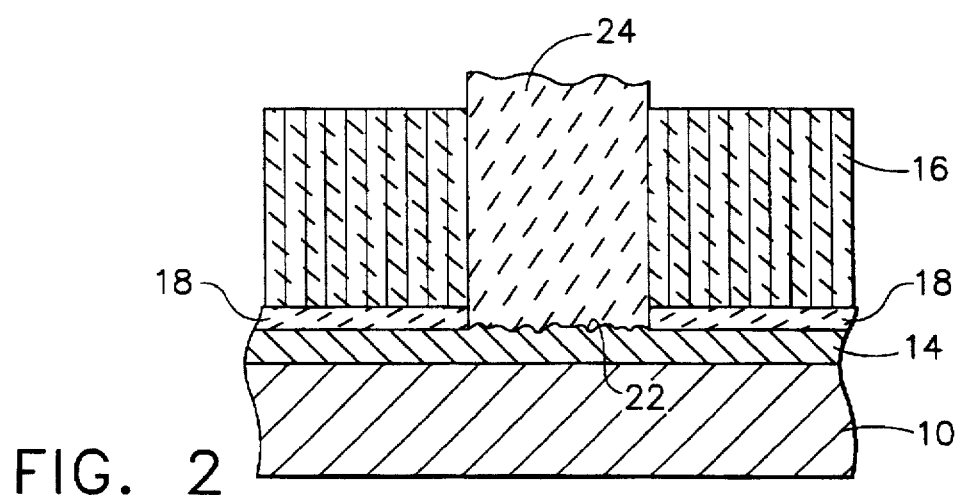
FIGS. 2 and 3 are cross-sectional representations of repair steps entailed in a preferred embodiment of this invention.

Once free of contaminants, the bond layer 14 is then treated such that its surface 22 becomes textured, as represented by FIG. 2. Preferred treating methods include grit blasting, micromachining, photolithography, laser etching and water jet techniques. Preferred grit blasting media include alumina, though other materials could be used. Suitable micromachining techniques include the use of mechanical indentors or cutting tools, the latter being dragged over the surface of the bond layer 14 to form an array of grooves. Finally, suitable photolithographic techniques include the use of positive or negative photoresists to form masks through which a suitable etchant is applied to chemically etch the surface of the bond layer 14. A preferred technique is to use a positive photoresist and an etching solution composed of, by weight, about twenty parts of hydrofluoric acid, about fifteen parts of sulfuric acid, about five parts of nitric acid, and about sixty parts of water.

The treatment selected should sufficiently texture the surface 22 of the bond layer 14 to yield macro surface features, resulting in an average surface roughness $R_a$ of at least about 300 micrometers. With laser techniques, such macro surface features can be in the form of a groove pattern that is selectively developed on the surface 22 of the bond layer 14. Laser techniques, and to a lesser extent grit blasting and water jet techniques, are also capable of producing a desirable combination of macro and micro surface features, as discussed below.

Figure 3:
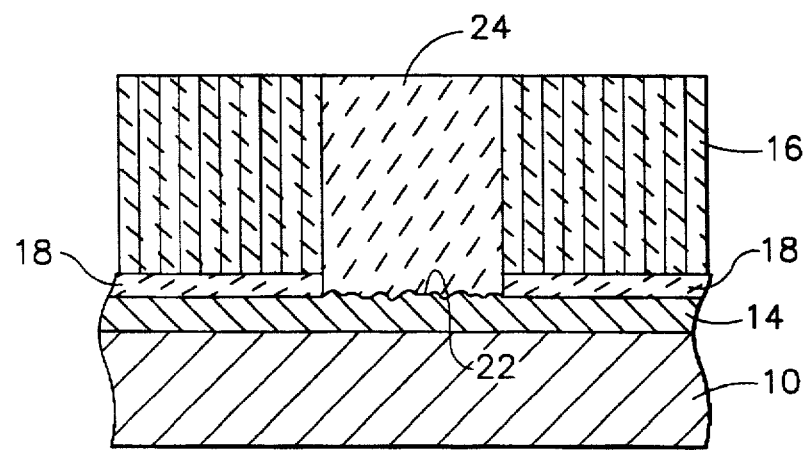

Finally, as represented in FIG. 2, a ceramic material is then deposited on the textured surface 22 of the bond layer 14 so as to form a ceramic repair layer 24 that completely covers the bond layer 14. A preferred deposition method is a plasma spray technique process, though physical vapor deposition techniques can be used to deposit the ceramic material such that the repair layer 24 has a columnar grain structure. With either technique, the ceramic layer 16 is masked to prevent deposition of the repair material on the ceramic layer 16. According to this invention, the preferred repair method is to form the repair layer 24 by plasma spray, the random ceramic grain structure of which is represented in FIGS. 2 and 3. Generally, masking of the surrounding surface of the ceramic layer 16 is less complicated if a plasma spray deposition technique is used. For example, if any holes are intentionally present in the article 10, such as cooling holes often present in airfoils to reduce their operating temperature, fibers can be placed in the holes or a gas can be flowed through the holes in order to prevent closure by the deposited ceramic. Furthermore, physical vapor deposition techniques generally result in the entire article 10 being heated to a high temperature, whereas plasma spray techniques directly heat only the localized region being repaired on the article 10.

Due to process control limitations, the ceramic material will typically be deposited until the surface of the repair layer 24 projects above the surrounding surface of the ceramic layer 16, as shown in FIG. 2. Afterwards, the surface of the repair layer 24 is polished or otherwise abraded until the repair layer 24 is substantially level with the ceramic layer 16, and the repair layer 24 merges with the ceramic layer 16 as portrayed in FIG. 3.

Thermal barrier coatings repaired in the manner described above have exhibited unexpectedly good thermal cycle resistance, particularly where the repair layer 24 is plasma sprayed directly on a thin platinum aluminide bond layer 14. Such results were determined by thermal cycle tests that were performed to demonstrate the feasibility of plasma sprayed thermal barrier coatings on platinum aluminide bond layers 14. The specimens were formed from the nickel superalloy Rene N5, with their respective bond layers 14 having thicknesses of about 62 micrometers. The bond layers 14 were formed by electroplating platinum, followed by a vapor aluminiding step. A unique combination of macro and micro surface features were then generated on the surfaces 22 of the bond layers 14 using a laser grooving technique. The macro surface features were created by laser scribing, and had the appearance of valleys extending about 10 to 40 micrometers into the surfaces 22. In contrast, the micro surface features were formed by redeposition of material that had been vaporized by the laser. The redeposited material had the appearance of droplets that formed peaks rising between the valleys and above the surfaces 22 a distance significantly less than the depth of the adjacent valleys. This combination of surface features is believed to be novel in the art.

A columnar YSZ ceramic layer 16 was then directly deposited on the textured surfaces 22 of the bond layers 14 to a thickness of about 125 micrometers using an air plasma spray process in accordance with this invention. The specimens were then thermal cycle tested between temperatures of about 150° C. and 1130° C. for 1800 cycles, with each cycle consisting of a hot soak at 1130° C. for about 45 minutes. The specimens exhibited a thermal cycle life equal to or greater than that of a standard thermal barrier coating, e.g., a columnar ceramic layer deposited by electron beam physical vapor deposition (EBPVD) methods on an oxide layer overlying an aluminide bond layer. The excellent thermal cycle lives of the specimens were attributed to the unique combination of macro and micro surface roughness generated by the laser grooving process, though it was concluded that similar results would be achieved with only macro surface features present on the surface of the bond layers 14.

From the above, it is apparent that this invention provides a significantly improved process for repairing thermal barrier coatings. Most notably, the method eliminates the prior practice of removing the entire original thermal barrier coating, and instead enables the repair of localized spallation. As such, the cost and time to repair a thermal barrier coated component is greatly reduced, though potentially with little or no adverse affect on the thermal cycle fatigue life of the repaired coating.

While our invention has been described in terms of a preferred embodiment, it is apparent that other forms could be adopted by one skilled in the art. Accordingly, the scope of our invention is to be limited only by the following claims.

What is claimed is:

1. A method for repairing a thermal barrier coating system on an article that has suffered localized spallation of a ceramic layer overlying a metallic bond layer on the article, a limited portion of the bond layer being exposed by the localized spallation of the ceramic layer and being surrounded by a remaining portion of the ceramic layer, the method comprising the steps of:

cleaning the limited portion of the bond layer exposed by the localized spallation so as to remove oxides and residue of the ceramic layer;

treating the limited portion of the bond layer so as to texture a surface thereof; and depositing a ceramic material on the surface of the limited portion of the bond layer so as to form a ceramic repair layer that completely covers the limited portion of the bond layer and contacts the remaining portion of the ceramic layer.

2. A method as recited in claim 1 wherein the ceramic layer was originally deposited on the article by a physical vapor deposition technique.

3. A method as recited in claim 1 wherein the cleaning step is a grit blasting process.

4. A method as recited in claim 1 wherein the treating step is a grit blasting process.

5. A method as recited in claim 1 wherein the treating step is a micromachining process.

6. A method as recited in claim 1 wherein the treating step is a photolithographic process.

7. A method as recited in claim 1 wherein the treating step is a laser grooving process.

8. A method as recited in claim 1 wherein the treating step results in the bond layer having an average surface roughness $R_a$ of at least about 300 µm.

9. A method as recited in claim 1 wherein the treating step results in the bond layer having a combination of surface features, a first of the surface features being characterized by valleys extending into the surface of the bond layer, a second of the surface features being characterized by peaks rising above the surface of the bond layer a distance less than the depth of the valleys of the first surface features.

10. A method as recited in claim 1 wherein the depositing step is a plasma spray process.

11. A method as recited in claim 1 wherein the depositing step entails depositing the ceramic material such that an upper surface of the repair layer projects above an adjacent portion of the ceramic layer, and then abrading the upper surface to a height substantially level with the adjacent portion of the ceramic layer.

12. A thermal barrier coating system repaired by the method recited in claim 1.

13. A method for repairing a thermal barrier coating system on an article that has suffered localized spallation of a PVD columnar ceramic layer overlying a metallic oxidation-resistant bond layer on the article, the method comprising the steps of:

cleaning the bond layer exposed by the localized spallation so as to remove oxides and residue of the ceramic layer;

treating the bond layer so as to texture a surface thereof while protecting the ceramic layer on the article;

plasma spraying a ceramic material on the surface of the bond layer so as to form a repair layer that completely covers the bond layer and such that an upper surface of the repair layer projects above an adjacent portion of the ceramic layer; and abrading the upper surface of the repair layer to a height substantially level with the adjacent portion of the ceramic layer.

14. A method as recited in claim 13 wherein the treating step is a grit blasting process.

15. A method as recited in claim 13 wherein the treating step is a micromachining process.

16. A method as recited in claim 13 wherein the treating step is a photolithographic process.

17. A method as recited in claim 13 wherein the treating step is a laser grooving process.

18. A method as recited in claim 13 wherein the treating step produces a combination of surface features on the surface of the bond layer, a first of the surface features being characterized by valleys in the surface of the bond layer and a second of the surface features being characterized by peaks rising from the surface between the valleys, the peaks of the second surface features rising above the surface of the bond layer a distance less than the depth of the valleys of the first surface features.

19. A thermal barrier coating system repaired by the method recited in claim 13.

20. A method for repairing a thermal barrier coating system on an article that has suffered localized spallation of a PVD columnar ceramic layer overlying an oxide layer and a metallic oxidation-resistant bond layer on the article, the method comprising the steps of:

cleaning the bond layer exposed by the localized spallation so as to remove oxides and residue of the oxide and ceramic layers;

treating the bond layer so as to texture a surface thereof while protecting the ceramic layer on the article;

depositing a ceramic material on the surface of the bond layer using a plasma spray technique so as to form a repair layer that completely covers the bond layer and such that an upper surface of the repair layer projects above an adjacent portion of the ceramic layer; and abrading the upper surface of the repair layer to a height substantially level with the adjacent portion of the ceramic layer.

* * * * *